(12) United States Patent
Kozhukh et al.

(10) Patent No.: US 7,033,930 B2
(45) Date of Patent: Apr. 25, 2006

(54) INTERCONNECT STRUCTURES IN A SEMICONDUCTOR DEVICE AND PROCESSES OF FORMATION

(75) Inventors: Michael Kozhukh, Palo Alto, CA (US); Oleg Rashkovskiy, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 148 days.

(21) Appl. No.: 10/648,950

(22) Filed: Aug. 26, 2003

(65) Prior Publication Data

US 2004/0038523 A1  Feb. 26, 2004

Related U.S. Application Data

(62) Division of application No. 10/066,089, filed on Jan. 30, 2002, now Pat. No. 6,709,971.

(51) Int. Cl.
 *H01L 21/4763* (2006.01)
(52) U.S. Cl. .............. 438/643; 438/597; 438/686; 438/660; 438/637; 438/699; 438/644; 438/648; 438/650; 438/658; 438/661; 438/687; 438/630; 438/655; 438/682
(58) Field of Classification Search ........ 438/643, 438/597, 686, 660, 637, 699, 644, 648, 650, 438/658, 661, 687, 630, 655, 682, 622; 257/768, 257/763, 770
See application file for complete search history.

(56) References Cited

U.S. PATENT DOCUMENTS

| | | | |
|---|---|---|---|
| 5,391,517 A | | 2/1995 | Gelatos et al. |
| 5,475,248 A | * | 12/1995 | Takenaka ................ 257/295 |
| 5,506,177 A | | 4/1996 | Kishimoto et al. |
| 5,700,718 A | | 12/1997 | McTeer |
| 5,763,953 A | * | 6/1998 | Iijima et al. .............. 257/762 |
| 5,973,402 A | | 10/1999 | Shinriki et al. |
| 6,147,403 A | * | 11/2000 | Matschitsch et al. ...... 257/751 |
| 6,174,810 B1 | | 1/2001 | Islam et al. |
| 6,333,260 B1 | * | 12/2001 | Kwon et al. .............. 438/643 |
| 6,348,404 B1 | | 2/2002 | Tabara et al. |
| 6,787,467 B1 | * | 9/2004 | Ogure et al. .............. 438/687 |
| 2002/0197850 A1 | * | 12/2002 | Ahn et al. ................ 438/635 |
| 2005/0020080 A1 | * | 1/2005 | Chiang et al. ........... 438/689 |

* cited by examiner

*Primary Examiner*—B. William Baumeister
*Assistant Examiner*—Victor V. Yevsikov
(74) *Attorney, Agent, or Firm*—Blakely, Sokoloff, Taylor & Zafman LLP

(57) ABSTRACT

Processes for fabricating a semiconductor device are described herein. In one aspect of the invention, an exemplary process includes forming an interface layer overlying the device substrate, forming a silver layer overlying the interface layer, annealing the substrate to form an intermetallic layer between the silver layer and the interface layer, the silver layer is in intimate contact with the intermetallic layer, and forming a protection layer overlying the silver layer. Other interconnect structures and processes are also described.

16 Claims, 10 Drawing Sheets

INTERCONNECT STRUCTURES IN A SEMICONDUCTOR DEVICE AND PROCESSES OF FORMATION

This application is a divisional of application Ser. No. 10/066,089, entitled "Interconnect Structures in a Semiconductor Device and Process of Formation", filed on Jan. 30, 2002 now U.S. Pat. No. 6,709,971.

FIELD OF THE INVENTION

This invention relates generally to semiconductor devices, and more particularly to an interconnect structure in a semiconductor device and its process of formation.

BACKGROUND OF THE INVENTION

As the demand for high performance integrated circuit devices continues to increase, designers have reduced circuit geometries in order to obtain improved performance. As the gate lengths of MOS transistors shrink to sub-half-micron dimensions, the switching speed of the transistors increases dramatically. To take full advantage of the increased speed of the transistors, electrical interconnect structures having high electrical conductivity must also be provided. The speed performance of advanced integrated circuit devices is often limited by the electrical conductivity of metal interconnects, which electrically couple the various device components of an integrated circuit.

Electrical conductivity of metal interconnections is extremely important for the integrated circuit (IC) speed. Alloy of aluminum is widely used in microelectronics for metal interconnections. However, aluminum alloy has a relatively low value of electrical conductivity. Copper has much higher conductivity and it has been widely used, because of its higher conductivity, to increase an IC speed in microprocessors. However, copper has a very high diffusion coefficient in silicon. It creates a risk of silicon contamination and destruction of silver devices, even at the room temperature. A number of precautionary measures are implemented to deal with this risk, such as separate tools, segregated manufacturing areas, defensive layers, low processing temperatures, etc. Moreover, the difficulties in implementing copper dry etching leads to the use of chemical mechanical polishing (CMP). CMP copper processing is subject to significant silicon contamination and requires additional cleaning procedures.

Thus, although the usage of copper in metal interconnects significantly improves IC speed, it also makes the manufacturing process more complicated, time consuming and expensive. Therefore, improved interconnects and process of forming the same are highly desirable.

BRIEF DESCRIPTION OF THE DRAWINGS

The present invention is illustrated by way of example and not limitation in the figures of the accompanying drawings in which like references indicate similar elements.

DETAILED DESCRIPTION

The metallization structure of the invention provides an improved silver interconnect structure in which diffusion of silver into underlying device layers is prevented. In addition, the improved metallization structure of the present invention enables silver interconnects to be reliably formed for electrically coupling integrated circuit device components without being contaminated. Using the metallization structure of the present invention, the advantages of silver interconnect metallurgy may be fully realized in a variety of integrated circuit applications. The following description and drawings are illustrative of the invention and are not to be construed as limiting the invention. Numerous specific details are described to provide a thorough understanding of the present invention. However, in certain instances, well-known or conventional details are not described in order to not unnecessarily obscure the present invention in detail.

FIGS. 1–6 illustrate, in cross-section, processes for the fabrication of a silver interconnect structure in accordance with one embodiment of the invention. The figures illustrate the formation of an inlaid silver interconnect in a dielectric body. The dielectric body is depicted to overlie a device substrate 102. In one embodiment, device substrate 102 is a monocrystalline silicon substrate. Alternatively, device substrate 102 may be a silicon-on-insulator substrate, a silicon-on-sapphire substrate, or the like.

Although not shown in FIGS. 1–6, those skilled in the art will appreciate that device substrate 102 will typically contain a large number of electrically coupled device components. The electrically coupled components may include MOS transistors, resistors, logic devices, and the like. Further, device substrate 102 may contain bipolar transistors in addition to MOS transistors. In addition, substrate 102 may include metal interconnect layers overlying other device components and electrically coupled to those device components. The present invention also contemplates that device substrate 102 may be a portion of a standard logic device, or hybrid device. Furthermore, device substrate 102 may be a portion of an integrated circuit package, and the process illustrated may be associated with the formation of package interconnections. Thus, all such conventional integrated circuit devices and discrete component devices may be present in device substrate 102, and such devices and packaging interconnections are within the scope of the present invention.

Figure 1:
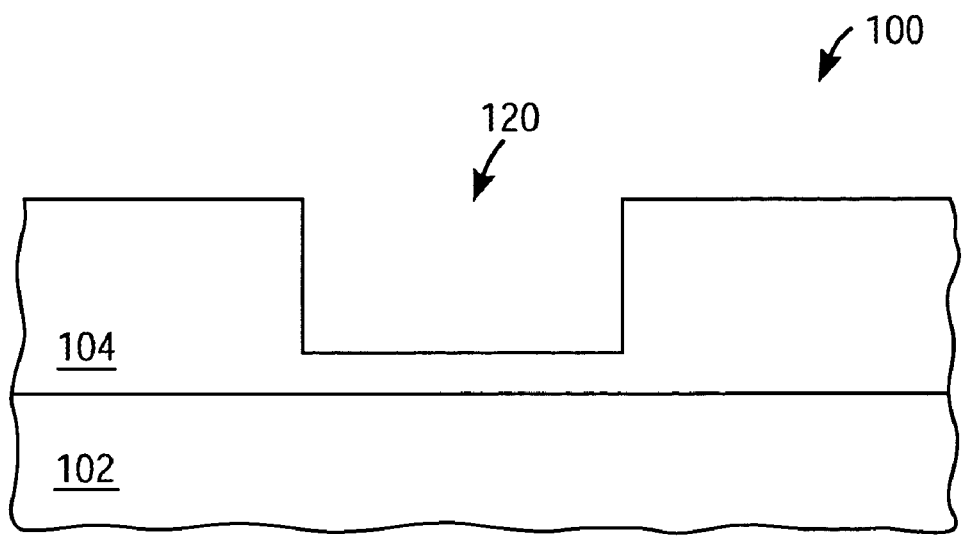
FIGS. 1–6 illustrate, in cross-section, process steps, in accordance with one embodiment.
Figure 2:
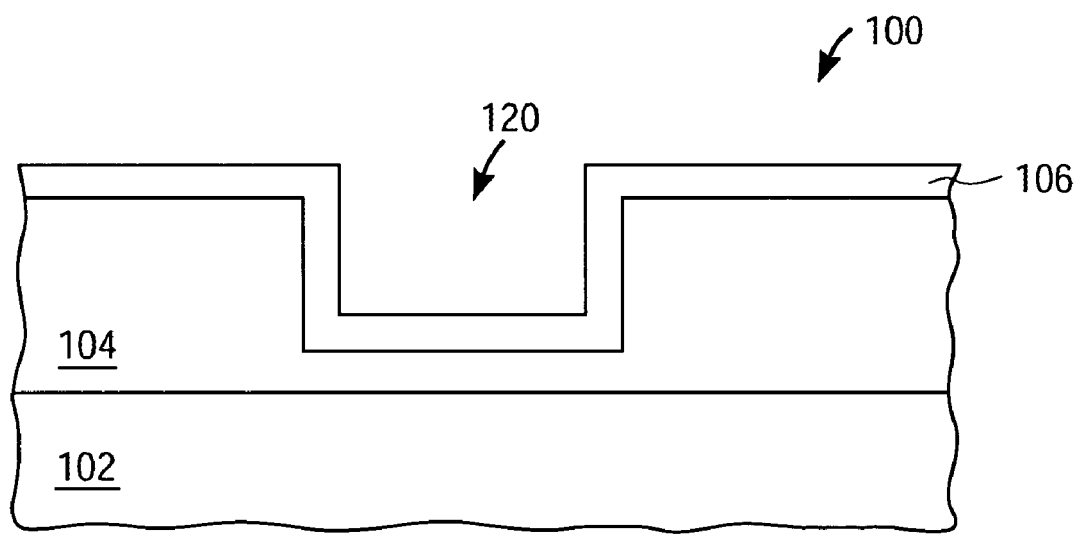
Figure 3:
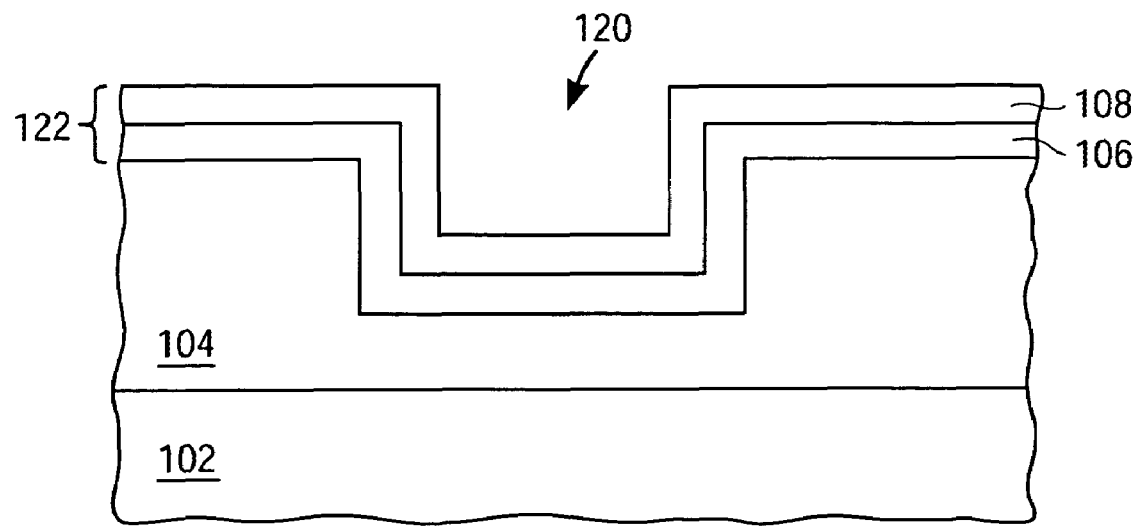

Shown in FIG. 1, in cross-section, is a portion of a semiconductor device, which includes a device substrate 102 and an overlying dielectric layer 104. As previously described, substrate 102 may include a variety of integrated circuit components already fully formed during previous fabrication steps. Dielectric layer 104 may be one of a number of different dielectric materials commonly used in integrated circuit fabrication. For example, dielectric layer 104 may be silicon dioxide, silicon nitride, or a doped glass layer, such as phosphorus silicate glass, boron silicate glass, and the like. In one embodiment, dielectric layer 104 is a layer of plasma deposited oxide which is formed using tetraethlyorthosilicate (TEOS) as a source gas. Alternatively, dielectric layer 104 may be a layer of silicon nitride, a layer of phosphosilicate glass (PSG), a layer of borophosphosilicate glass (BPSG), an spin-on-glass (SOG) layer, a silicon oxynitride layer, a polyamide layer, a low dielectric constant insulator, or the like. In addition, a combination of the foregoing dielectric materials may also be used to form dielectric layer 104.

Depending upon the particular dielectric material, dielectric layer 104 is formed by chemical vapor deposition deposited (CVD), plasma enhanced chemical vapor deposition (PECVD), or deposition at atmospheric pressure. In one embodiment, dielectric layer 104 is a chemical vapor deposited material, such as silicon dioxide or silicon nitride, which may be deposited over a planarized insulating layer (not shown).

Once dielectric layer 104 has been deposited, a cavity 120 is formed in the dielectric layer. In one embodiment, cavity 120 is formed by reactive ion etching using a photolithographic mask to define the lateral extent of the cavity. As illustrated in FIG. 1, cavity 120 does not completely extend through dielectric layer 104. Although cavity 120 is illustrated in a preferred configuration, cavity 120 may have a configuration substantially different than that illustrated in FIG. 1. For example, cavity 120 may have rounded corners, or be substantially elongated in a lateral or vertical direction.

After forming cavity 120, silver interface is formed on the surface of dielectric layer 104, and within cavity 120. The interface, collectively identified as interface layers 122, includes two individual metal layers. The interface layers 122 of the present invention includes a particular combination of metals which promote the adhesion of silver to device substrate 102, and prevent the diffusion of silver into the underlying substrate. The interface layer 122 may be deposited on the dielectric layer 104, using a conventional sputter deposition process. In one embodiment, the interface layers 122 may be deposited through a dc-sputtering deposition process.

In one embodiment, the interface layers 122 include a diffusion barrier layer 108 and an adhesion layer 106. In one embodiment, the diffusion barrier layer 108 may contain titanium nitride. Alternatively, the diffusion barrier layer 108 may contain tantalum nitride. The adhesion layer 106 may contain titanium. Alternatively, the adhesion layer 106 may contain titanium nitride or tungsten.

In one embodiment, the adhesion layer 106 overlies the surface of dielectric layer 104, and diffusion barrier layer 108 overlies the adhesion layer 106. Specifically, diffusion barrier layer 108 provides a diffusion barrier preventing the transport of silver into the underlying dielectric and device substrate layers. The adhesion layer 106 promotes the adhesion of silver to the interface layer 122. In an alternative embodiment, other metals having the necessary adhesive and diffusion barrier characteristics may be employed to form interface layer 122. For example, titanium tungsten or tantalum may be used in the place of titanium nitride as a diffusion barrier.

Preferably, interface layer 122 is formed in a multi-stage sputtering apparatus. In the first stage of the sputtering system, adhesion layer 106 is sputtered onto dielectric layer 104 to a thickness of about 1000 angstroms (Å). In the second stage of the sputtering system, diffusion barrier layer 108 is sputtered onto adhesion layer 106 to a thickness of about 5000 Å.

During the multi-stage sputtering process used to form interface layers 122, device substrate 102 is transported between the various sputtering chambers in the multi-stage system without exposing device substrate 102 to ambient atmospheric conditions. In the multi-stage sputtering system, the sputter deposition chambers and the transfer chambers are either maintained in inert gas at a reduced pressure by continually purging the chambers and transfer systems with an inert gas, such as argon, or nitrogen, or the like. Alternatively, the transfer system may be maintained under high vacuum. By maintaining inert atmospheric conditions during the sputter deposition process, the formation of titanium oxide and other metallic oxide layers are prevented. The fabrication of interface layer 122 in an inert environment ensures the preservation of the adhesion and diffusion barrier characteristics of interface layer 122. In an alternative embodiment, the diffusion barrier and adhesion layers of interface layer 122 may be formed in separate deposition apparatus. However, care must be taken to ensure that any native oxide or other metallic oxide layers, which may form on the surface of a deposited layer, are removed prior to the deposition of subsequent layers. In one embodiment, cleaning process may be employed between each process of layers.

Figure 4:
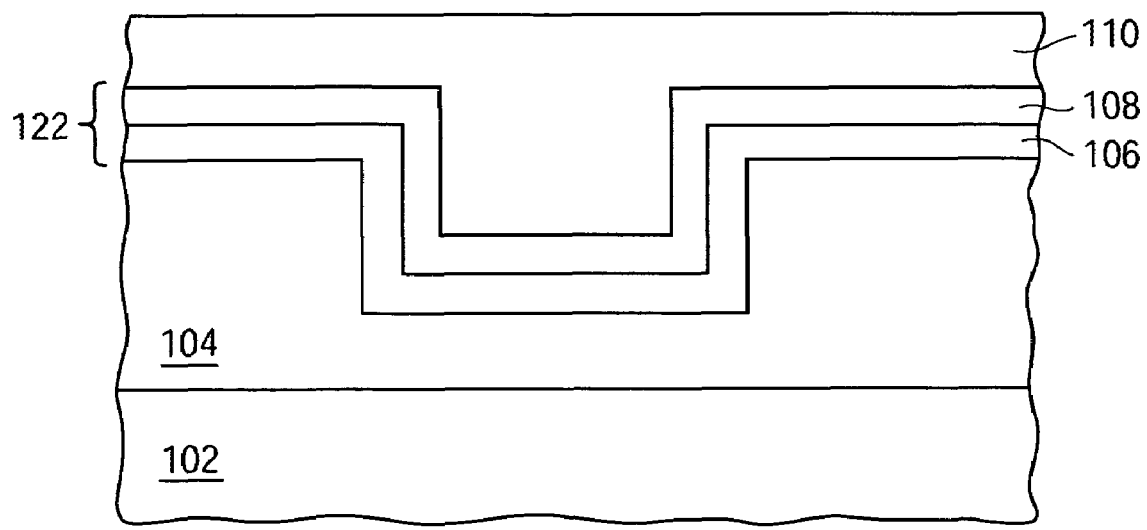

Once the fabrication of interface layers 122 are completed, a layer of silver is deposited onto interface layer 122, as illustrated in FIG. 4. Silver layer 110 is deposited to a thickness sufficient to completely fill cavity 120, and to overlie adjacent regions of interface layer 122. The silver layer 110 may be deposited through a sputter deposition process, such as dc-sputtering. In one embodiment, the silver layer 110 may be deposited using argon (Ar) gas, with a pressure ranging from 0.1–100 millitorr, and at a substrate temperature ranging from a room temperature to 50 degrees Celsius. Additionally, it is also within the scope of the invention that other silver deposition techniques may be used. For example, silver may be deposited by conventional thermal vapor deposition, plasma-assisted chemical vapor deposition, plasma-enhanced chemical vapor deposition, laser chemical vapor deposition, sputter deposition, electroplating, and the like.

Figure 5:
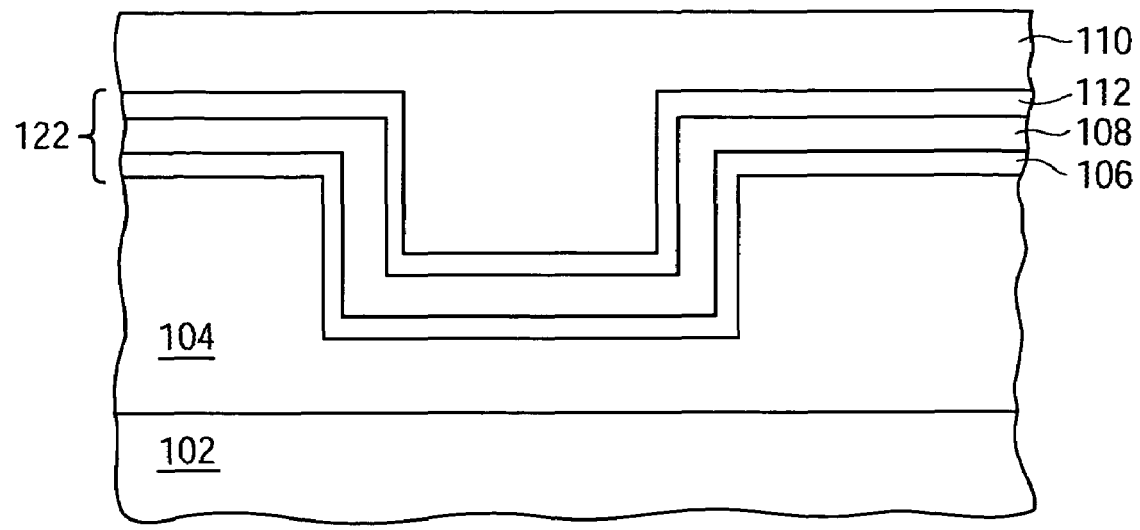

After the silver deposition is completed, the inventive process continues with the annealing of substrate 102 to form a silver diffusion barrier intermetallic layer 112, as illustrated in FIG. 5. In one embodiment, when titanium nitride is used as diffusion barrier material, the silver diffusion barrier intermetallic layer includes silver titanium nitride (Ag—TiN) intermetallic layer. Preferably, silver diffusion barrier intermetallic layer 112 is formed by annealing substrate 102 in a rapid thermal annealing apparatus. The rapid thermal annealing process may be carried out, in an inert gas environment such as argon gas, at an atmospheric pressure and at an ambient temperature ranging from 350 to 450 degree Celsius, preferably at 400 degree Celsius. Other gas may be utilized. Alternatively, the thermal annealing process may be carried out in a vacuumed ambient. In one embodiment, the vacuumed ambient may contain a pressure of about 10 millitorr. The annealing time may, depend upon the exact annealing conditions employed. Within the previously described operating conditions, an annealing time of about one hour is sufficient to form the silver diffusion barrier intermetallic layer. In one embodiment, the silver diffusion barrier intermetallic layer may have a thickness ranging from 100 to 500 Å. Other annealing processes may be employed to form the silver diffusion barrier intermetallic layer 112.

Silver diffusion barrier intermetallic layer 112 provides an adhesive body which adheres silver layer 110 to adhesion layer 106. During the annealing process, silver and diffusion barrier layer undergo an interdiffusion process. In the absence of diffusion barrier layer 108, silver could diffuse into underlying dielectric layer 104. However, diffusion barrier layer 108 prevents the diffusion of silver to the underlying layers. Thus, the presence of diffusion barrier layer 108 advantageously promotes the formation of an adhesive intermetallic layer for preventing diffusion of silver beyond the diffusion barrier layer 108 and intermetallic layer 112.

Figure 6:
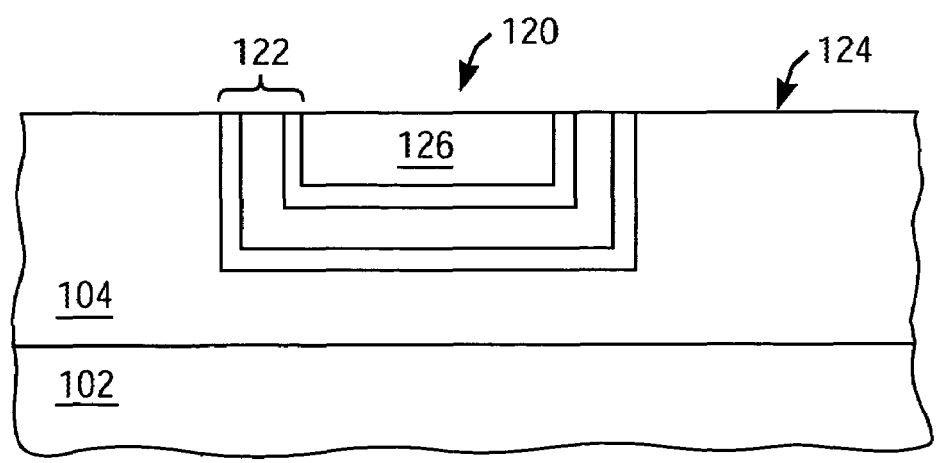

Following the formation of silver diffusion barrier intermetallic layer 112, substrate 102 is subjected to a planarization process which forms a planar surface 124, as illustrated in FIG. 6. To form planar surface 124, portions of silver layer 110 and interface layer 122 are non-selectively removed. Preferably, planar surface 124 is formed by chemical-mechanical-polishing (CMP), using a non-selective slurry composition. The slurry composition contains a silica abrasive material, which removes the different metal layers at substantially the same rate. Alternatively, planar surface 124 may be formed by a non-selective plasma etching process. The plasma etching process may include additional planarizing layers deposited onto silver layer 110. For example, a layer of photoresist may be deposited onto silver layer 110 prior to performing the non-selective etch process.

Upon completion of the non-selective removal process and the formation of planar surface 124, an inlaid silver interconnect 126 remains within a central portion of cavity 120 and imbedded within interface layer 122. Only a portion of silver interconnect 126 is illustrated in FIG. 6. It would be appreciated that the foregoing process steps may be repeated in order to fabricate additional levels of conductive interconnects. Although silver interconnect 126 is illustrated as residing in one defined layer, it is to be understood that other such silver interconnect layers and interface layers may be formed in subsequently deposited dielectric layers, such as dielectric layer, overlying silver interconnect 126.

Figure 7:
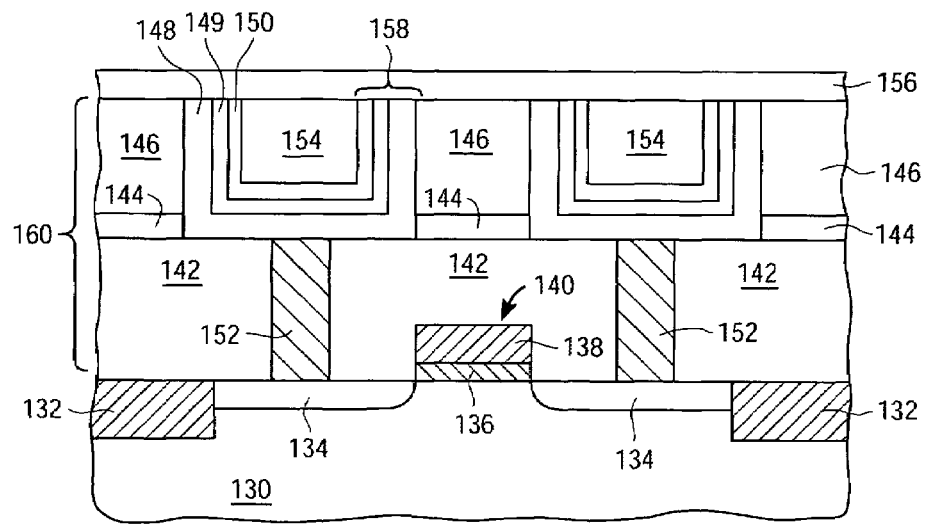
FIG. 7 illustrates, in cross-section, an interconnect structure in accordance with an alternative embodiment.

The particular combination of metal layers and processing steps described in the foregoing embodiment results in the formation of a silver interconnect which may be utilized in a variety of integrated circuit structures. One example of the utilization of the silver interconnect structure and process of the invention is illustrated in FIG. 7. Referring to FIG. 7, after transistor 140 and field isolation regions 132 have been formed, an interlevel dielectric layer 160 is formed overlying transistor 140 and field isolation regions 132. In one embodiment, interlevel dielectric layer 160 comprises dielectric layer 142, etch stop layer 144 and dielectric layer 146.

Dielectric layer 142 may be a layer of plasma deposited oxide which is deposited using TEOS as a source gas. Alternatively, dielectric layer 142 may be a layer of PSG, a layer of BPSG, an SOG layer, a polyamide layer, a low dielectric constant insulator, or the like. Etch stop layer 144 may be a layer of plasma deposited silicon oxynitride. Alternatively, etch stop layer 144 may be a layer of plasma deposited silicon nitride, a layer of boron nitride, or the like. Dielectric layer 146 may be a layer of plasma deposited oxide which is formed using TEOS as a source gas. Alternatively, dielectric layer 146 may be a layer of PSG, a layer of BPSG, an SOG layer, a polyamide layer, a low dielectric constant insulator, or the like. It should be appreciated that interlevel dielectric layer 160 need not be formed using different dielectric material. For example, interlevel dielectric layer 160 could be formed using a single dielectric material, such as plasma deposited oxide, PSG, BPSG, SOG, polyamide, a low dielectric constant insulator, or the like.

In one embodiment, etch stop layer 144 is a layer of silicon oxynitride which is formed using conventional plasma deposition techniques. Alternatively, etch stop layer 144 may be a layer of plasma deposited silicon nitride, a boron nitride layer, or the like.

A portion of dielectric layer 146 and a portion of etch stop layer 144 are then removed to expose a portion of via plugs 152 and form interconnect opening. Interface layer 158 is formed in accordance with the previously described processing steps and directly overlies the exposed portion of via plugs 152. A silver interconnect 154 is then formed in accordance with the previously described processing steps. Via plugs 152 enables a subsequently deposited conductive layer 156 to be electrically coupled to source/drain regions 134 of the transistor 140 through silver interconnect 154 and interface layer 158. It would be appreciated that the foregoing process steps may be repeated in order to fabricate additional levels of conductive interconnects.

FIGS. 8–19 illustrate, in cross-section, processes for the fabrication of a silver interconnect structure in accordance with an alternative embodiment of the invention. The figures illustrate the formation of a silver interconnect on a device substrate 200. In one embodiment, device substrate 200 is a monocrystalline silicon substrate. Alternatively, device substrate 200 may be a silicon-on-insulator substrate, a silicon-on-sapphire substrate, or the like.

Although not shown in FIGS. 8–19, those skilled in the art will appreciate that device substrate 200 will typically contain a large number of electrically coupled device components. The electrically coupled components may include MOS transistors, resistors, logic devices, and the like. Further, device substrate 200 may contain bipolar transistors in addition to MOS transistors. In addition, substrate 200 may include metal interconnect layers overlying other device components and electrically coupled to those device components. The present invention also contemplates that device substrate 200 may be a portion of a standard logic device, or hybrid device. Furthermore, device substrate 200 may be a portion of an integrated circuit package, and the process illustrated may be associated with the formation of package interconnections. Thus, all such conventional integrated circuit devices and discrete component devices, may be present in device substrate 200, and such devices and packaging interconnections are within the scope of the present invention.

Figure 8:
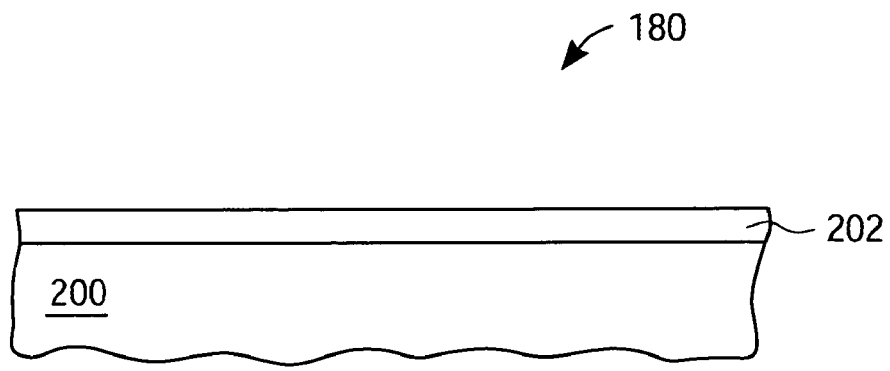
FIGS. 8–19 illustrate, in cross-section, process steps, in accordance with an alternative embodiment.
Figure 9:
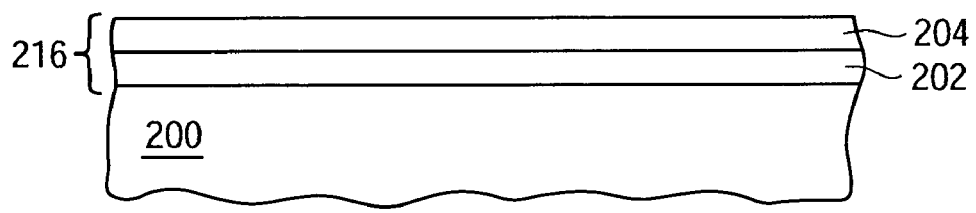

A silver interface is then formed on the surface of device substrate 200, as illustrated in FIGS. 8 and 9. The interface metallurgy, collectively identified as interface layer 216, includes two individual metal layers. The interface layer 216 of the present invention includes a particular combination of metals which promote the adhesion of silver to device substrate 200, and prevent the diffusion of silver into the underlying substrate. The interface layer 216 may be deposited on the device substrate 200, using a conventional sputter deposition process. In one embodiment, the interface layer 216 may be deposited through a dc-sputtering deposition process.

In one embodiment, the interface layer 216 includes a diffusion barrier layer 204 and an adhesion layer 202. In one embodiment, the diffusion barrier layer 204 may contain titanium nitride. Alternatively, the diffusion barrier layer 204 may contain tantalum nitride. The adhesion layer 202 may contain titanium. Alternatively, the adhesion layer 202 may contain titanium nitride or tungsten.

In one embodiment, the adhesion layer 202 overlies the surface device substrate 200, and diffusion barrier layer 204 overlies the adhesion layer 202. Specifically, diffusion barrier layer 204 provides a diffusion barrier preventing the transport of silver into the underlying device substrate. The adhesion layer 202 promotes the adhesion of silver to the interface layer 216. In an alternative embodiment, other metals having the necessary adhesive and diffusion barrier characteristics may be employed to form interface layer 216. For example, titanium tungsten or tantalum may be used in the place of titanium nitride as a diffusion barrier.

Preferably, interface layer 216 is formed in a multi-stage sputtering apparatus. In the first stage of the sputtering system, adhesion layer 202 is sputtered onto device substrate 200 to a thickness of preferably about 1000 Å. In the second stage of the sputtering system, diffusion barrier layer 204 is sputtered onto adhesion layer 202 to a thickness of preferably about 5000 Å.

During the multi-stage sputtering process used to form interface layer 216, device substrate 200 is transported between the various sputtering chambers in the multi-stage system without exposing device substrate 200 to ambient atmospheric conditions. In the multi-stage sputtering system, the sputter deposition chambers and the transfer chambers are either maintained in inert atmospheric conditions by continually purging the chambers and transfer systems with an inert gas, such as argon, or nitrogen, or the like. Alternatively, the transfer system may be maintained under high vacuum. By maintaining inert atmospheric conditions during the sputter deposition process, the formation of titanium oxide and other metallic oxide layers are prevented. The fabrication of interface layer 216 in an inert environment ensures the preservation of the adhesion and diffusion barrier characteristics of interface layer 216. In an alternative embodiment, the diffusion barrier and adhesion layers of interface layer 216 may be formed in separate deposition apparatus. However, care must be taken to ensure that any native oxide or other metallic oxide layers, which may form on the surface of a deposited layer, are removed prior to the deposition of subsequent layers. In one embodiment, cleaning process may be employed between each process of layers.

Figure 10:
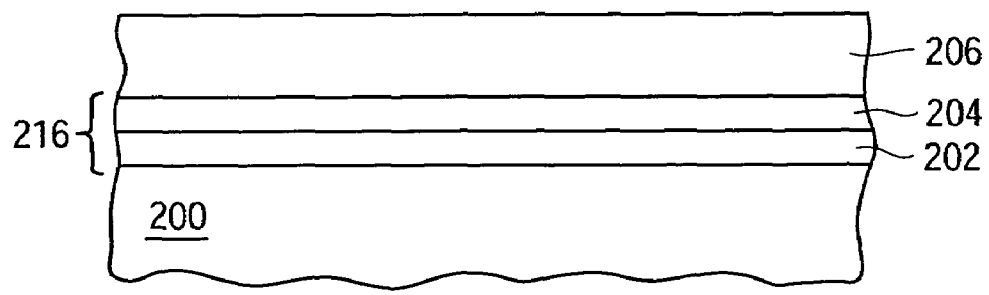

Once the fabrication of interface layer 216 is complete, a layer of silver is deposited onto interface layer 216, as illustrated in FIG. 10. Silver layer 206 is deposited to overlie adjacent regions of interface layer 216. The silver layer 206 may be deposited through a sputter deposition process, such as dc-sputter deposition process. In one embodiment, the silver layer 206 may be deposited using argon (Ar) gas as a source gas, with a pressure ranging from 0.1–100 millitorr, and at a temperature ranging from a room temperature to 50 degrees Celsius. Additionally, it is also within the scope of the invention that other silver deposition techniques may be used. For example, silver may be deposited by conventional thermal vapor deposition, plasma-assisted chemical vapor deposition, plasma-enhanced chemical vapor deposition, laser chemical vapor deposition, sputter deposition, electroplating, and the like.

Figure 11:

After the deposition of silver is complete, the inventive process continues with the annealing of substrate 200 to form a silver diffusion barrier intermetallic layer 208, as illustrated in FIG. 11. In one embodiment, when titanium nitride is used as diffusion barrier material, a silver titanium nitride (Ag—TiN) intermetallic layer is formed. Preferably, silver diffusion barrier intermetallic layer 208 is formed by annealing device substrate 200 in a rapid thermal annealing apparatus. The rapid thermal annealing process may be carried out, in an inert gas environment such as argon gas, at an atmospheric pressure and at an ambient temperature ranging from 350 to 450 degree Celsius, preferably at 400 degree Celsius. Other gas may be utilized. Alternatively, the thermal annealing process may be carried out in a vacuumed ambient. In one embodiment, the vacuumed ambient may contain a pressure of about 10 millitorr. The annealing time may depend upon the exact annealing conditions employed. In one embodiment, the silver diffusion barrier intermetallic layer may have a thickness ranging from 100 to 500 Å. Within the previously described operating conditions, an annealing time of about one hour is sufficient to form the silver diffusion barrier intermetallic layer. Alternatively, silver diffusion barrier intermetallic layer 208 may be formed by conventional thermal annealing in a forming gas ambient. Other annealing processes may be employed to form the silver diffusion barrier intermetallic layer 208.

Silver diffusion barrier intermetallic layer 208 provides a diffusion body which adheres silver layer 206 with adhesion layer 202. A particular advantage of the present invention includes the interaction of diffusion barrier layer 204 and silver layer 206 during the formation of silver diffusion barrier intermetallic layer 208. During the annealing process, silver and diffusion barrier layer undergo an interdiffusion process. In the absence of diffusion barrier layer 204, silver could diffuse into underlying device substrate 200. However, diffusion barrier layer 202 prevents the diffusion of silver to the underlying layers. Thus, the presence of diffusion barrier layer 204 advantageously promotes the formation of an adhesive intermetallic layer by preventing diffusion of silver.

After the annealing of the device substrate, silver layer 206 is patterned through a lithography process, as illustrated in FIGS. 12–15. In one embodiment, the silver layer 206 is patterned through an ultraviolet (UV) lithography process. Conventional UV lithography on aluminum and copper requires deposition of antireflective film to reduce reflective notching in the photoresist mask, when photoresist overlying highly reflective copper or aluminum interconnects is lithographically exposed. However, UV lithography on silver does not require additional coating (e.g., antireflective coating) because silver reflectivity in UV region is relatively small (e.g., at wavelength less than 350 nanometer reflectivity is about 20 percent, where aluminum has about 95%).

Figure 12:
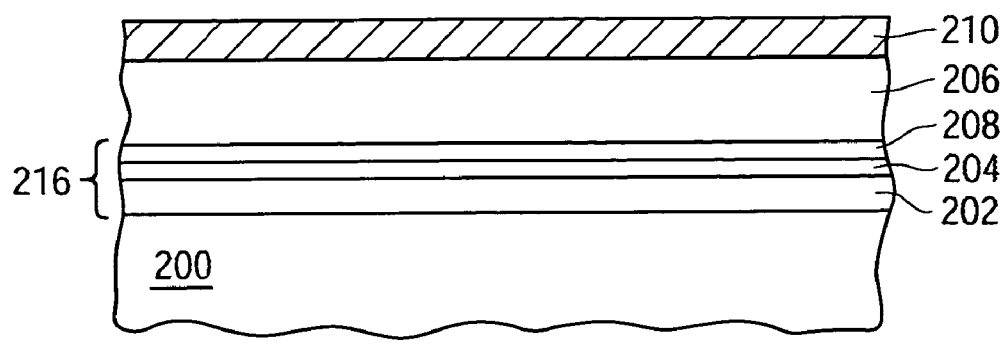
Figure 13:
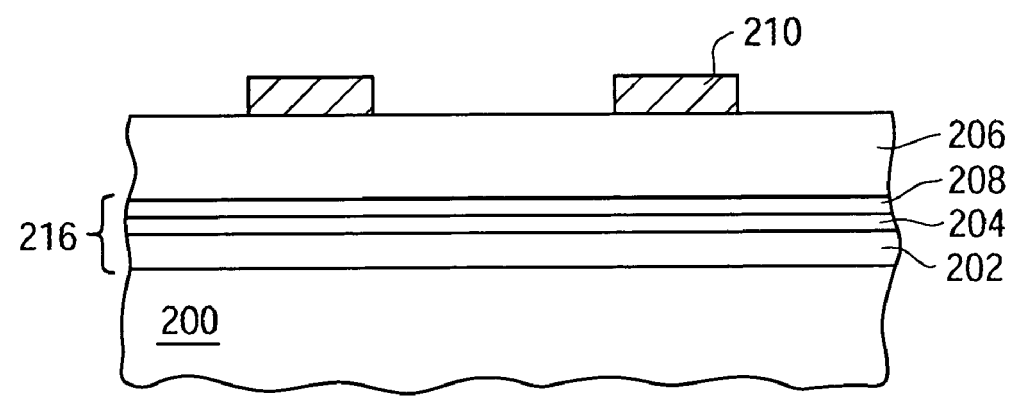

During the UV lithography process, a photoresist mask 210 is placed directly on the surface of silver layer 236 without an antireflective coating, as illustrated in FIG. 12. The photoresist mask 210 is then exposed to UV light. As a result, the chemical structure of some of the photoresist mask 210 materials are changed. After a developing process, only a portion of the mask 210 that covers the interconnect is remained. Other lithography process may be employed.

Figure 14:
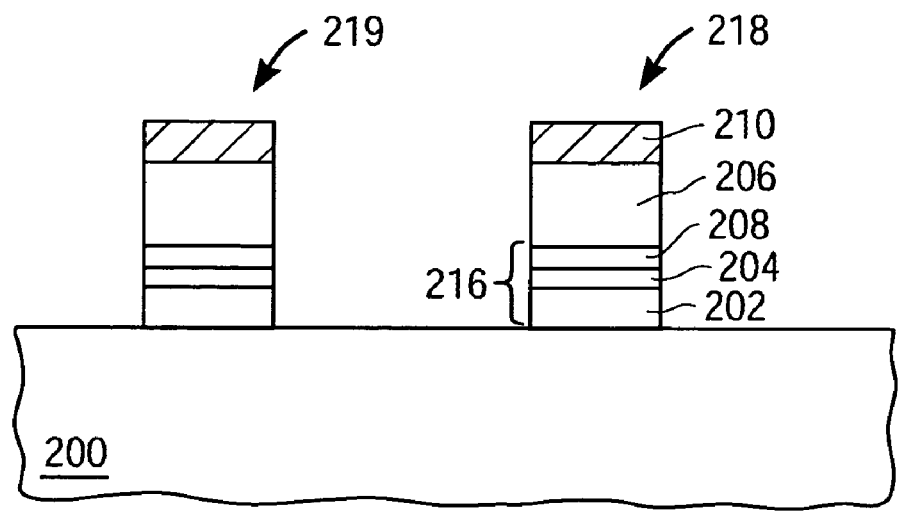
Figure 15:
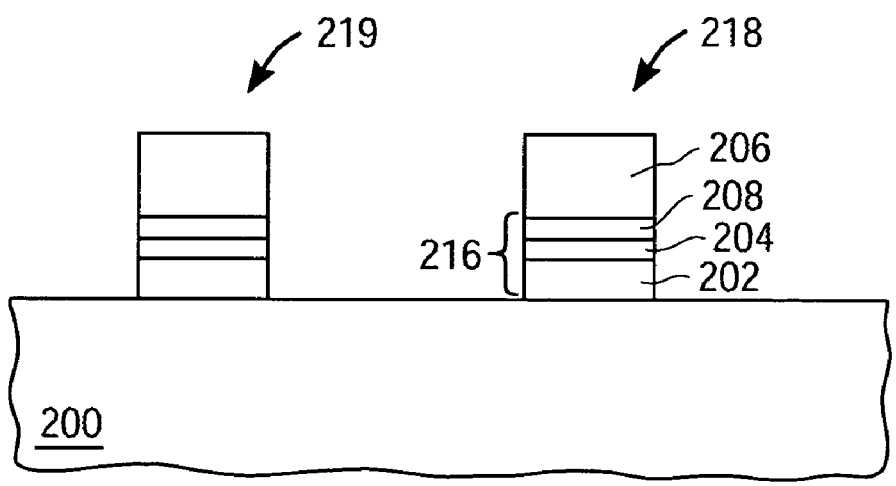

After the UV lithography process, portion of the silver layer 206 and the interface layer 216 are removed to form the silver interconnect 218 and 219, as illustrated in FIGS. 14 and 15. The removal of the above portion may be performed through an etching process. In one embodiment, the removal process may be performed through a dry etching processing using oxygen ($O_2$) as a source gas. Alternatively, the removal process may be performed through a dry etching processing using carbon fluoride as a source gas, such as $CF_4$. Other etching process, such as wet etching, may be utilized. Thereafter, the device substrate may be cleaned using a solution to remove the remaining photoresist mask 210. As a result, the interconnect 218 is exposed, as illustrated in FIG. 15.

Figure 16:
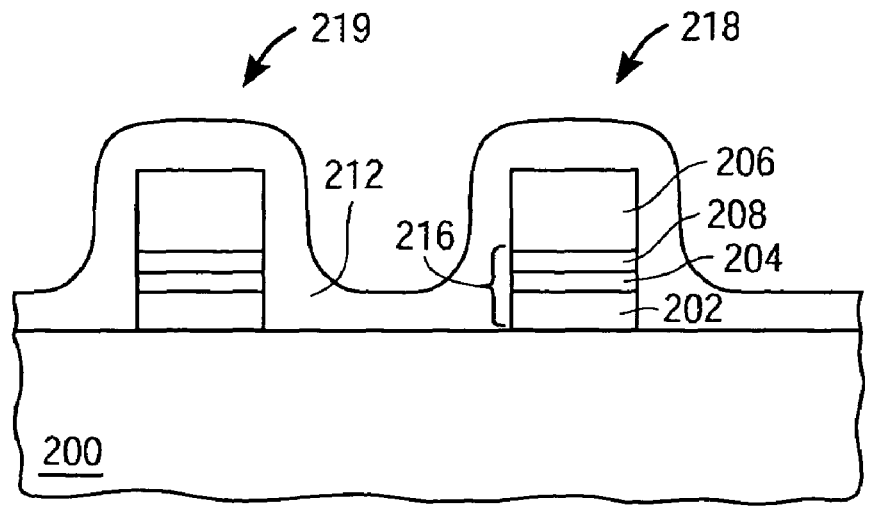

After the interconnect 218 is formed, a protection layer 212 is deposited overlying the silver layer 206 and the interface layer 216, as illustrated in FIG. 16. The protection layer 212 is formed to prevent silver layer 206 from diffusion into other materials, such as dielectric, layer 214 of FIG. 18. In one embodiment, protection layer 212 may be a layer of titanium. In an alternative embodiment, protection layer 212 may be a layer of titanium nitride or tantalum nitride. In a further alternative embodiment, the protection layer may be a layer of tungsten. Other materials that prevent silver diffusion may be utilized as a protection layer.

Protection layer 212 may be deposited using a conventional sputter deposition process. In one embodiment, protection layer 212 may be deposited through a dc-sputter deposition process. In an alternative embodiment, the sputter deposition process may be performed in a nitrogen atmospheric environment. It should be appreciated that the protection layer 212 is thick enough to prevent the silver layer 206 from diffusion. In one embodiment, the protection layer 212 has a minimum thickness of about 2000 Å.

Figure 17:
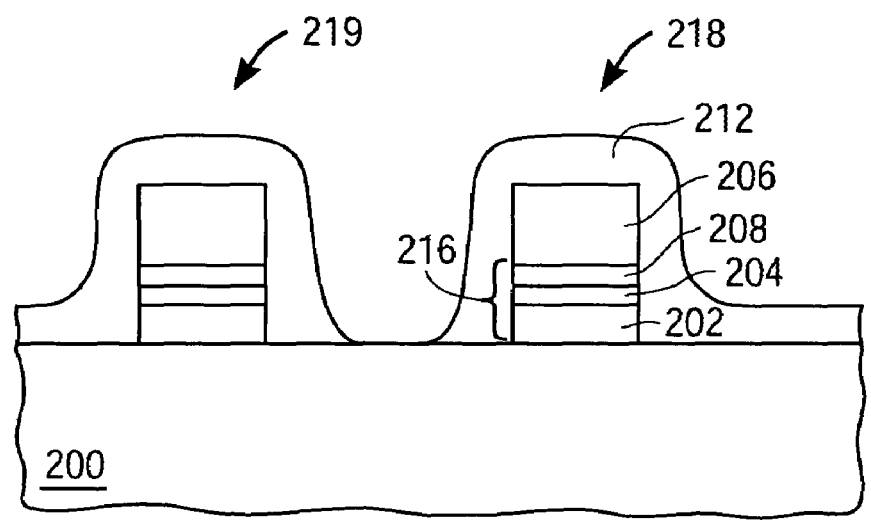

After the protection layer 212 is deposited overlying the silver layer 206 and the interface layer 216, the silver interconnect structure is patterned through a lithography process, as illustrated in FIG. 17. In one embodiment, the silver interconnect structure is patterned through an ultraviolet (UV) lithography process. The purpose of the UV lithography process is to remove extra protection layer 212 that may unnecessarily connect multiple silver interconnects. After the UV lithography process, portion of the protection layer 212 which connects the silver interconnects 218 and 219 is removed, as illustrated in FIG. 17.

Figure 18:
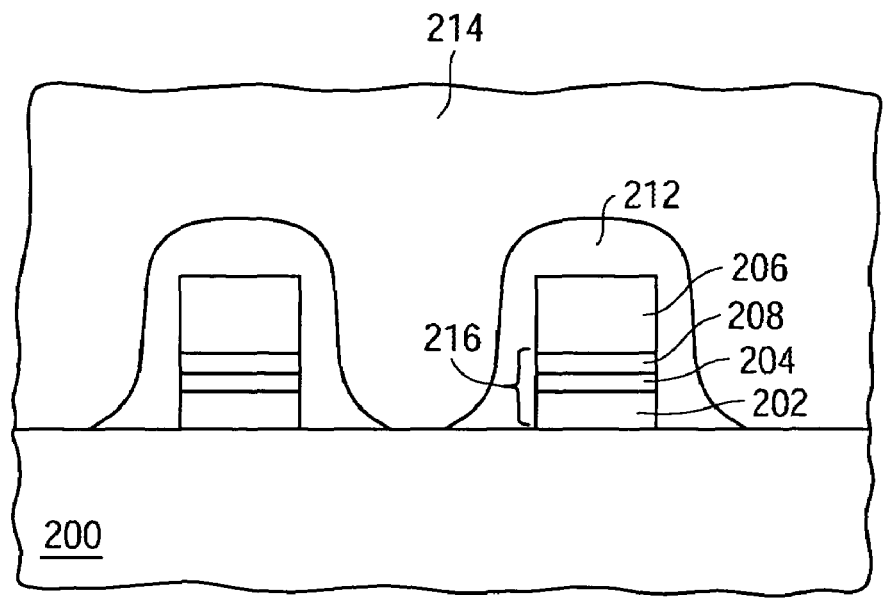

Upon completion of the protection layer, a dielectric layer 214 is formed overlying the silver interconnects 218–219, and the device substrate 200, as illustrated in FIG. 18. Dielectric layer 214 may be one of a number of different dielectric materials commonly used in integrated circuit fabrication. For example, dielectric layer 214 may be silicon dioxide, silicon nitride, or a glass layer, such as phosphorus silicate glass (PSG), boron silicate glass, and the like. In one embodiment, dielectric layer 214 is a layer of plasma deposited oxide which is formed using TEOS as a source gas. Alternatively, dielectric layer 214 may be a layer of silicon nitride, a layer of PSG, a layer of BPSG, an SOG layer, a silicon oxynitride layer, a polyamide layer, a low dielectric constant insulator, or the like. In addition, a combination of the foregoing dielectric materials may also be used to form dielectric layer 214.

Depending upon the particular dielectric material, dielectric layer 214 is formed by chemical vapor deposition deposited (CVD), plasma enhanced chemical vapor deposition (PECVD). In one embodiment, dielectric layer 214 is a chemical vapor deposited material, such as silicon dioxide or silicon nitride, which may be deposited over a planarized insulating layer (not shown).

Figure 19:
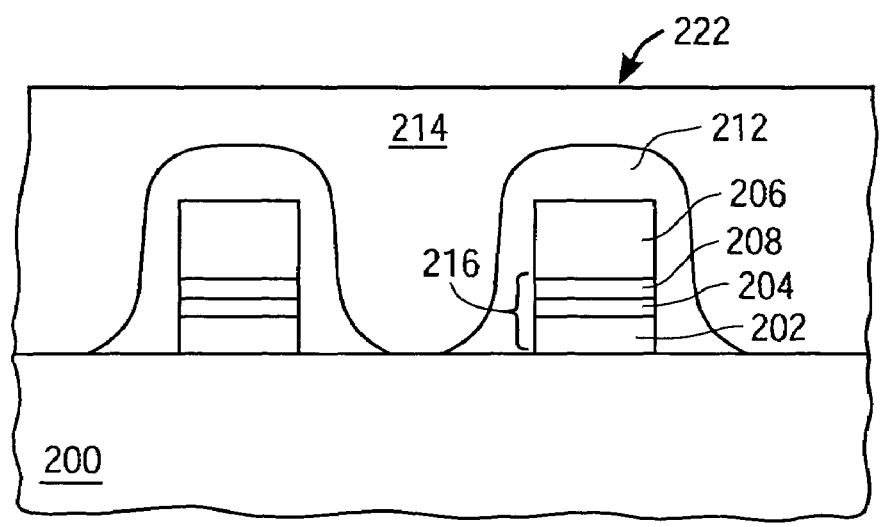

Following the formation dielectric layer 214, substrate 200 is subjected to a planarization process which forms a planar surface 222, as illustrated in FIG. 19. To form planar surface 222, portion of the dielectric layer 213 is removed. Preferably, planar surface 222 is formed by chemical-mechanical-polishing (CMP), using a non-selective slurry composition. The slurry composition contains a silica abrasive material. Alternatively, planar surface 222 may be formed by a non-selective plasma etching process.

It would be appreciated that the foregoing process steps may be repeated in order to fabricate additional levels of conductive interconnects.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A process, comprising:
    providing a device substrate having a dielectric layer thereon;
    removing a portion of the dielectric layer to create an opening;
    forming an interface layer within the opening;
    forming a silver layer overlying the interface layer;
    annealing the substrate to form an intermetallic layer between the silver layer and the interface layer, in which the silver layer is in intimate contact with the intermetallic layer; and
    forming a conductive protection layer overlying the silver layer which is thick enough to prevent the silver layer from diffusing into other materials.

2. The process of claim 1, further comprising removing portion of the silver layer, intermetallic layer, and the interface layer overlying the dielectric, layer to form a smooth surface.

3. The process of claim 2, wherein the removing comprises a chemical-mechanical-polishing (CMP) process.

4. The process of claim 1, wherein the interface layer comprises an adhesion layer and a diffusion barrier layer overlying the adhesion layer.

5. The process of claim 4, wherein the diffusion barrier layer comprises titanium nitride or tantalum nitride.

6. The process of claim 4, wherein the adhesion layer comprises titanium, tungsten, aluminum, or titanium nitride.

7. The process of claim 1, wherein the interface layer is formed using sputter deposition process.

8. The process of claim 1, wherein the silver layer is formed using sputter deposition process.

9. The process of claim 1, wherein the substrate is annealed at an ambient temperature of approximate 400 degree Celsius for a period of approximate one hour.

10. An interconnect structure, comprising:
    a device substrate;
    an interface layer overlying the device substrate;
    a silver layer overlying the interface layer;
    a conductive layer overlying the silver layer which is thick enough to prevent the silver layer from diffusing into other materials; and
    a dielectric layer overlying the protection layer.

11. The interconnect structure of claim 10, wherein the interface layer comprises an adhesion layer and a diffusion barrier layer overlying the adhesion layer.

12. The interconnect structure of claim 11, wherein the diffusion barrier layer comprises titanium nitride or tantalum nitride, and wherein the adhesion layer comprises titanium, titanium nitride, aluminum, or tungsten.

13. The interconnect structure of claim 10, wherein the protection layer comprises titanium, titanium nitride, or tungsten.

14. An interconnect structure, comprising:
    a device substrate;
    a dielectric layer overlying the device substrate, the dielectric layer having a cavity therein;
    an interface layer overlying the dielectric layer, the interface layer having a thickness insufficient to completely fill the cavity;
    a silver layer overlying the interface layer, the silver layer having a thickness sufficient to completely fill the cavity; and
    a conductive layer overlying the silver layer which is thick enough to prevent the silver layer from diffusing into other materials.

15. The interconnect structure of claim 14, wherein the interface layer comprises an adhesion layer and a diffusion barrier layer overlying the adhesion layer.

16. The interconnect structure of claim 15, wherein the diffusion barrier layer comprises titanium nitride or tantalum nitride, and wherein the adhesion layer comprises titanium, titanium nitride, aluminum, or tungsten.

* * * * *

UNITED STATES PATENT AND TRADEMARK OFFICE
CERTIFICATE OF CORRECTION

PATENT NO. : 7,033,930 B2  Page 1 of 1
APPLICATION NO. : 10/648950
DATED : April 25, 2006
INVENTOR(S) : Kozhukh et al.

It is certified that error appears in the above-identified patent and that said Letters Patent is hereby corrected as shown below:

In column 8, at line 32, delete "236" and insert --206--.

In column 10, at line 10, delete ",".

Signed and Sealed this

Fourth Day of December, 2007

JON W. DUDAS
*Director of the United States Patent and Trademark Office*